(12) United States Patent
Kasahara

(10) Patent No.: US 12,171,146 B2
(45) Date of Patent: Dec. 17, 2024

(54) VIBRATOR DEVICE

(71) Applicant: Seiko Epson Corporation, Tokyo (JP)

(72) Inventor: Shoichiro Kasahara, Minowa (JP)

(73) Assignee: SEIKO EPSON CORPORATION (JP)

( * ) Notice: Subject to any disclaimer, the term of this patent is extended or adjusted under 35 U.S.C. 154(b) by 709 days.

(21) Appl. No.: 17/399,508

(22) Filed: Aug. 11, 2021

(65) Prior Publication Data
US 2022/0052250 A1 Feb. 17, 2022

(30) Foreign Application Priority Data

Aug. 12, 2020 (JP) ................. 2020-136444

(51) Int. Cl.
H01L 41/053 (2006.01)
H10N 30/20 (2023.01)
H10N 30/87 (2023.01)
H10N 30/88 (2023.01)

(52) U.S. Cl.
CPC ........... *H10N 30/20* (2023.02); *H10N 30/872* (2023.02); *H10N 30/88* (2023.02)

(58) Field of Classification Search
CPC ....... H10N 30/20; H10N 30/88; H10N 30/872
USPC ...................................................... 310/348
See application file for complete search history.

(56) References Cited

U.S. PATENT DOCUMENTS

| 8,384,486 | B2 | 2/2013 | Nishio | |
| 9,083,312 | B1* | 7/2015 | Byers | ..................... H05K 13/04 |
| 2002/0040444 | A1 | 4/2002 | Ohie et al. | |
| 2007/0152537 | A1* | 7/2007 | Yamaguchi | .............. G01L 17/00 310/311 |
| 2007/0229178 | A1* | 10/2007 | Harima | ..................... H03B 5/32 331/158 |
| 2017/0104473 | A1 | 4/2017 | Fukuzawa | |
| 2020/0058843 | A1 | 2/2020 | Mizugaki | |
| 2020/0207283 | A1 | 7/2020 | Mizugaki | |
| 2020/0212874 | A1 | 7/2020 | Mizugaki | |

FOREIGN PATENT DOCUMENTS

| JP | 2002-175127 A | 6/2002 | |
| JP | 2009-027477 A | 2/2009 | |
| JP | 2012-050057 A | 3/2012 | |
| JP | 2012-070418 A | 4/2012 | |
| JP | 2014-146907 A | 8/2014 | |
| JP | 2014-150453 A | 8/2014 | |
| JP | 2014-205235 A | 10/2014 | |
| JP | 2017-073683 A | 4/2017 | |
| JP | 2017073683 | * 4/2017 | ............... H03B 5/36 |
| JP | 2017-139717 A | 8/2017 | |
| JP | 2020-108088 A | 7/2020 | |
| JP | 2020-108109 A | 7/2020 | |

* cited by examiner

*Primary Examiner* — Derek J Rosenau
(74) *Attorney, Agent, or Firm* — Harness, Dickey & Pierce, P.L.C.

(57) ABSTRACT

A vibrator device includes a package including a base that is a semiconductor substrate and a lid that is a semiconductor substrate and has a housing section, a vibrator element and a passive element housed in the housing section and placed at the base, an oscillation circuit placed at the base and electrically coupled to the vibrator element, and a circuit that is placed at the base or the lid, is electrically coupled to the passive element, and operates based on an oscillation signal from the oscillation circuit.

8 Claims, 7 Drawing Sheets

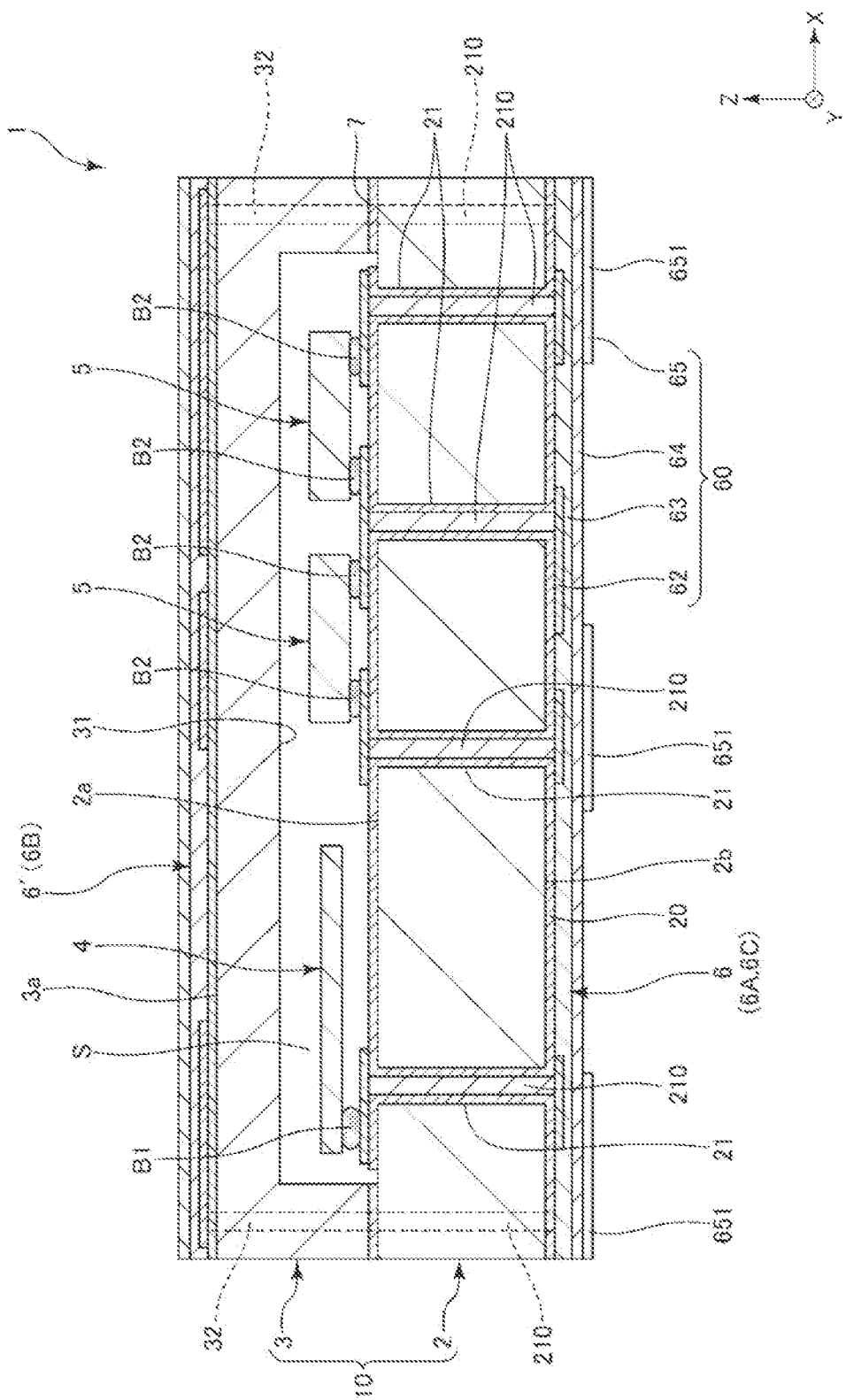

VIBRATOR DEVICE

The present application is based on, and claims priority from JP Application Serial Number 2020-136444, filed Aug. 12, 2020, the disclosure of which is hereby incorporated by reference herein in its entirety.

BACKGROUND

1. Technical Field

The present disclosure relates to a vibrator device.

2. Related Art

JP-A-2002-175127 describes a microcontroller including an oscillation circuit and a USB control section as a transmission control section that operates based on an oscillation signal from the oscillation circuit. In the microcontroller, a vibrator is externally coupled to the oscillation circuit.

In the configuration described in JP-A-2002-175127, the USB control section and the vibrator are separately mounted on a mounting substrate. A large mounting area is therefore required, and it is therefore difficult to reduce the size of the microcontroller.

SUMMARY

A vibrator device according to the present disclosure includes a package including a base that is a semiconductor substrate and a lid that is a semiconductor substrate and has a housing section, a vibrator element and a passive element housed in the housing section and placed at the base, an oscillation circuit placed at the base and electrically coupled to the vibrator element, and a circuit that is placed at the base or the lid, is electrically coupled to the passive element, and operates based on an oscillation signal from the oscillation circuit.

BRIEF DESCRIPTION OF THE DRAWINGS

FIG. 7 is a cross-sectional view showing a vibrator device according to a fifth embodiment.

DESCRIPTION OF EXEMPLARY EMBODIMENTS

A vibrator device according to an application example of the present disclosure will be described below in detail based on embodiments shown in the accompanying drawings.

First Embodiment

Figure 1:
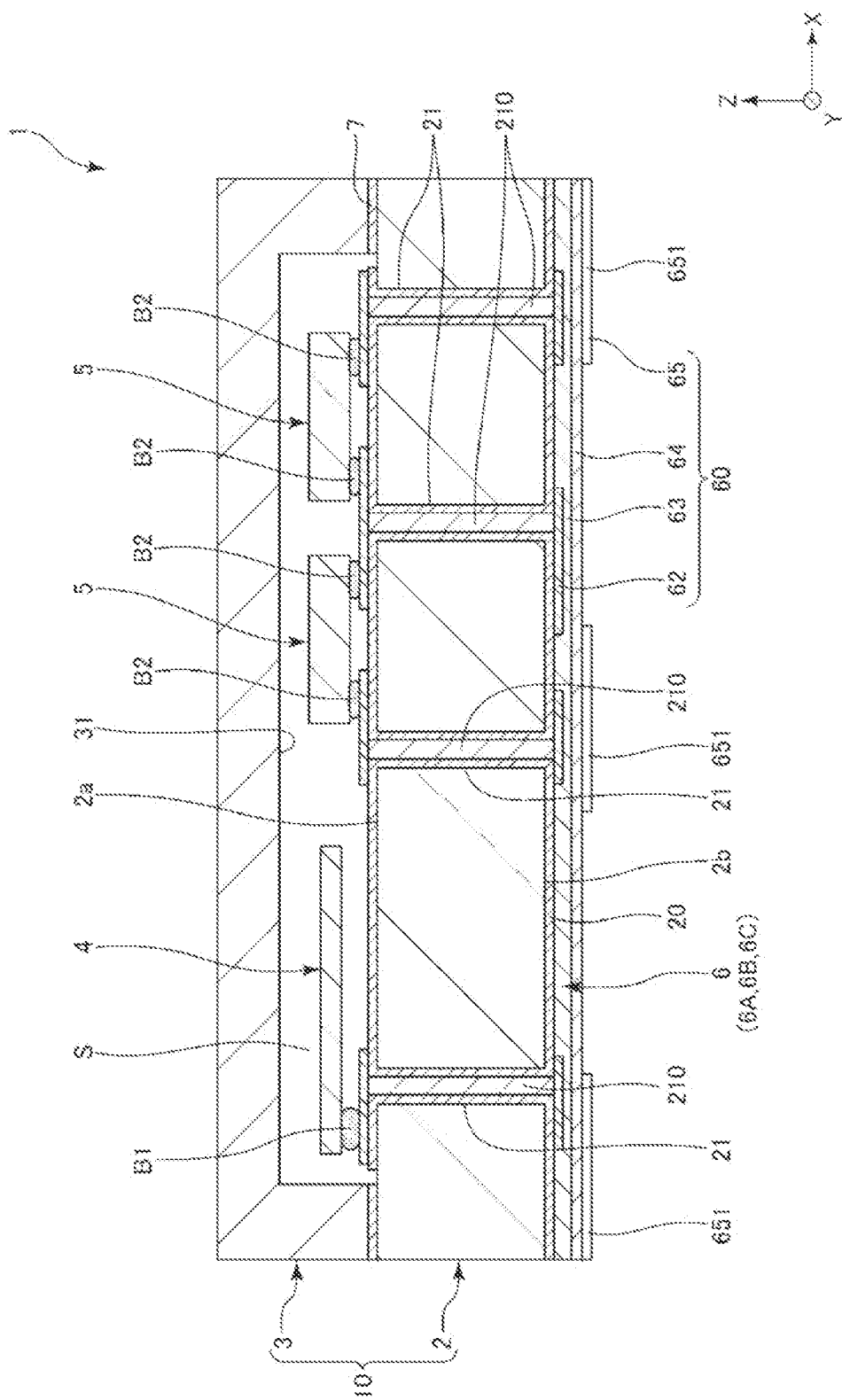
FIG. 1 is a cross-sectional view showing a vibrator device according to a first embodiment.
Figure 2:
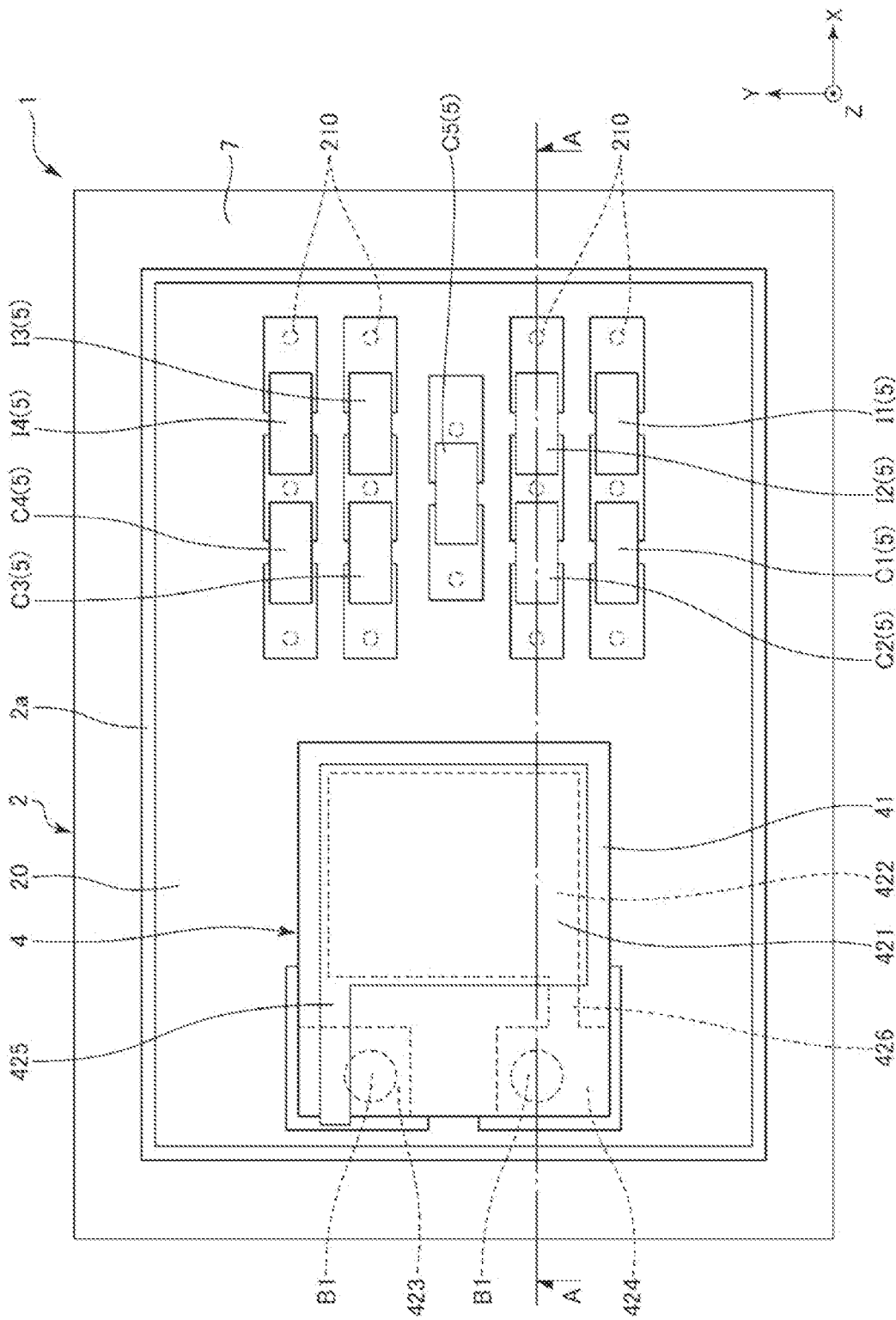
FIG. 2 is a plan view showing a vibrator element and passive elements provided in the vibrator device in FIG. 1.
Figure 3:
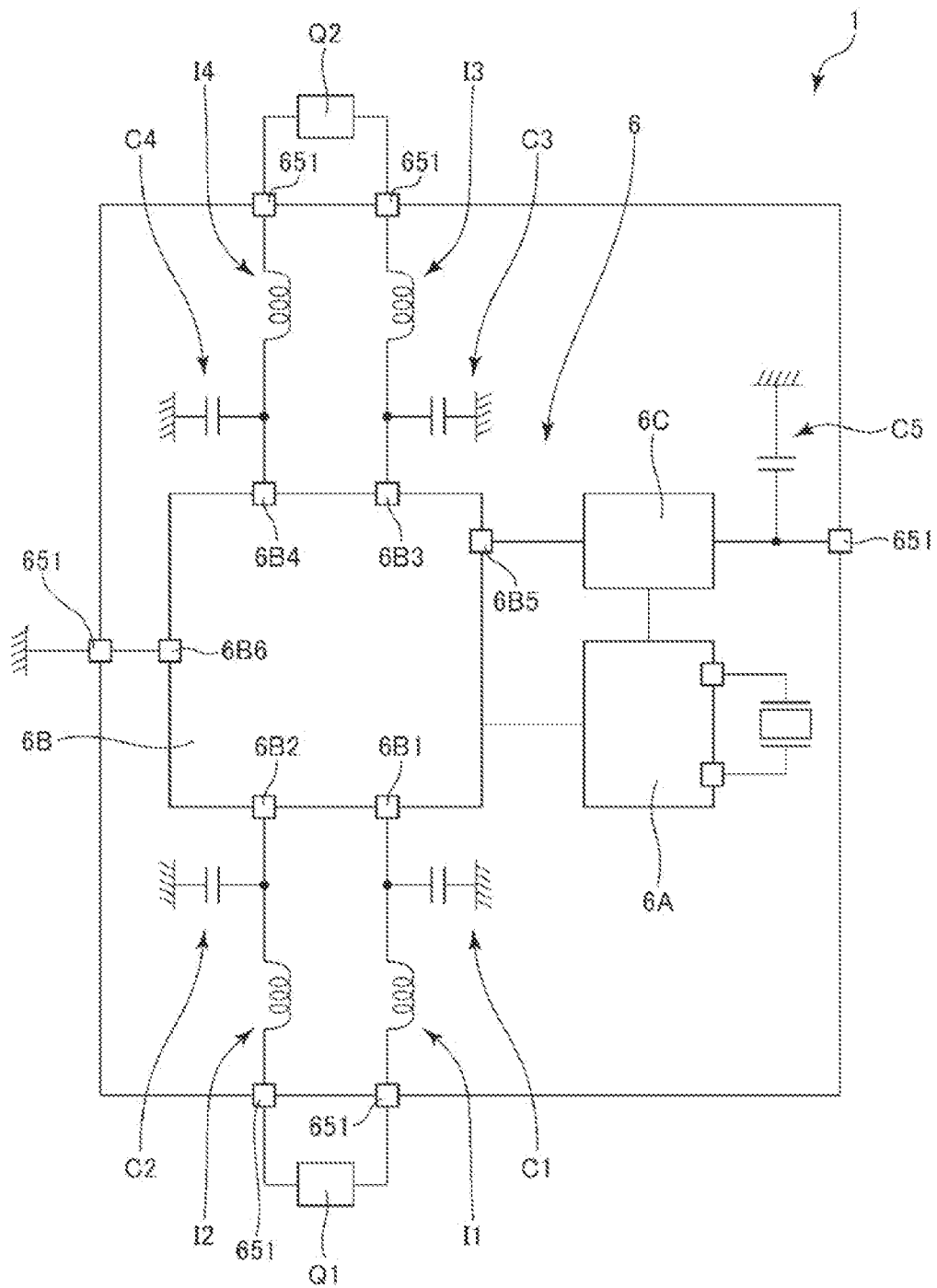
FIG. 3 is a block diagram showing the circuit configuration of the vibrator device in FIG. 1.

FIG. 1 is a cross-sectional view showing a vibrator device 1 according to a first embodiment. FIG. 2 is a plan view showing a vibrator element and passive elements provided in the vibrator device 1 in FIG. 1. FIG. 3 is a block diagram showing the circuit configuration of the vibrator device 1 in FIG. 1.

FIG. 1 is a cross-sectional view taken along the line A-A in FIG. 2. FIGS. 1 and 2 show axes X, Y, and Z as three axes perpendicular to one another for convenience of description. The side that the arrow in the axis-Z direction faces is also called an "upper side", and the opposite side is also called a "lower side". A plan view viewed in the axis-Z direction is also simply referred to as a "plan view". In the following description, "placement at an upper surface" includes not only placement directly at the upper surface but placement in a position separate from the upper surface by a predetermined distance, that is, "placement in a position facing the upper side". The same holds true for a lower surface.

The vibrator device 1 shown in FIG. 1 includes a package 10, which has an internal housing section S, a vibrator element 4, and a plurality of passive elements 5, the latter two components housed in the housing section S. The package 10 includes a base 2, at which the vibrator element 4 and the passive elements 5 are placed, and a lid 3 so bonded to an upper surface 2a of the base 2 as to cover the vibrator element 4 and the passive elements 5. An integrated circuit 6 is formed at the base 2.

The base 2 is a silicon substrate, particularly, a P-type silicon substrate. It is, however, noted that the base 2 is not limited to a specific substrate and may instead be an N-type silicon substrate. Still instead, the base 2 may be a semiconductor substrate that is not made of silicon, for example, a semiconductor substrate made of Ge, GaP, GaAs, InP, or any other suitable substance.

The base 2 has a plate-like shape and has the upper surface 2a and a lower surface 2b, which are a front surface and a rear surface, respectively. The surfaces of the base 2 are covered with an insulating film 20. The integrated circuit 6, which is electrically coupled to the vibrator element 4 and the passive elements 5, is formed at the lower surface 2b of the base 2. Forming the integrated circuit 6 at the base 2 as described above allows effective use of the space occupied by the base 2. In particular, forming the integrated circuit 6 at the lower surface 2b allows the space where the integrated circuit 6 is formed to be widened, as compared with a case where the integrated circuit 6 is formed at the upper surface 2a, by the size corresponding to the region where the upper surface 2a is bonded to the lid 3. It is, however, noted that the integrated circuit 6 may be formed at the upper surface 2a of the base 2 instead of the lower surface 2b thereof.

The integrated circuit 6 includes an oscillation circuit 6A, which is electrically coupled to the vibrator element 4 and generates an oscillation signal, such as a clock signal, by causing the vibrator element 4 to oscillate, a circuit 6B, which operates based on the oscillation signal outputted from the oscillation circuit 6A, and a regulator circuit 6C, which supplies the oscillation circuit 6A and the circuit 6B with stable electric power. The circuit 6B is not limited to a specific circuit. In the present embodiment, the circuit 6B is a USB controller IC that is a transmission circuit that controls transmission and reception of signals via a USB connector. Using the transmission circuit as the circuit 6B allows the vibrator device 1 to be incorporated in a variety of electronic instruments, whereby the convenience provided by the vibrator device 1 is improved. The integrated circuit 6 may include circuits in addition to the circuits described above. Examples of the circuits to be added may include a processing circuit that processes the oscillation signal from the oscillation circuit 6A. Further, the processing circuit may, for example, be a PLL circuit.

A laminate 60, which is formed of a wiring layer 62, an insulating layer 63, a passivation film 64, and a terminal layer 65 laminated on each other, is provided at the lower surface 2b of the base 2. A plurality of active elements that are not shown but are formed at the lower surface 2b are electrically coupled to each other via wiring lines provided in the wiring layer 62 to form the integrated circuit 6. The terminal layer 65 includes a plurality of mounting terminals 651. The plurality of mounting terminals 651 are electrically coupled to the integrated circuit 6 and the passive elements 5 and include, for example, a terminal coupled to a power supply, a terminal coupled to the ground, a terminal electrically coupled to an upstream upper-level terminal, and a terminal electrically coupled to a downstream peripheral terminal. Providing the plurality of mounting terminals 651, which face in the direction away from the package 10 allows the vibrator device 1 to be readily electrically coupled to an external apparatus.

The insulating layer 63 is made of silicon oxide ($SiO_2$), and the wiring layer 62 and the terminal layer 65 are made of an electrically conductive material, such as electrically conductive polysilicon and tungsten (W). It is, however, noted that the material that forms each of the sections described above is not limited to a specific material and can be any material that can provide the function of the section.

In the present embodiment, the laminate 60 includes one wiring layer 62 for convenience of description, but not necessarily, and a plurality of wiring layers 62 may be laminated on each other via the insulation layer 63. That is, the wiring layer 62 and the insulating layer 63 may be alternately laminated on each other multiple times. In this case, for example, wiring lines can be routed in a circuit and the plurality of mounting terminals 651 can be placed with increased degrees of flexibility.

A plurality of through holes 21 are formed in the base 2 and pass through the base 2 in the thickness direction thereof. The through holes 21 are each filled with an electrically conductive material. Through electrodes 210 are thus formed. Wiring lines electrically coupled to the vibrator element 4 and wiring lines electrically coupled to the passive elements 5 are placed on the upper surface 2a of the base 2, as shown in FIG. 2. The wiring lines are electrically coupled to the oscillation circuit 6A, the circuit 6B, and the circuit 6C via the through electrodes 210.

The circuit 6B includes a pair of upstream terminals 6B1 and 6B2, a pair of downstream terminals 6B3 and 6B4, a power supply terminal 6B5, and a negative power supply terminal 6B6, as shown in FIG. 3. An upper-level terminal Q1 is coupled to the pair of upstream terminals 6B1 and 6B2, and a peripheral terminal Q2 is coupled to the pair of downstream terminals 6B3 and 6B4. The thus configured circuit 6B uses the oscillation signal from the oscillation circuit 6A to operate in synchronization with transmission signals from the upper-level terminal Q1 and the peripheral terminal Q2.

The passive elements 5 are each an element that consumes, accumulates, or dissipates supplied electric power, such as a capacitor, an inductor, and a resistor. The number of passive elements 5 and what is used as each of the passive elements 5 can be set as appropriate in accordance with the application of the vibrator device 1. Each of the passive elements 5 has a chip-like shape, is fixed to the upper surface 2a of the base 2 via an electrically conductive bonding member B2, and is electrically coupled to the corresponding wiring line.

In the present embodiment, the following components are used as the passive elements 5: a capacitor C1 and an inductor I1 coupled to the upstream terminal 6B1; a capacitor C2 and an inductor 12 coupled to the upstream terminal 6B2; a capacitor C3 and an inductor 13 coupled to the downstream terminal 6B3; and a capacitor C4 and an inductor 14 coupled to the downstream terminal 6B4. Electrostatic protection capacitors and common-mode filters (noise reduction filters) are thus formed to improve the anti-electrostatic performance of the vibrator device 1 and remove noise from a signal transmitted via the circuit 6B, whereby the characteristics of the circuit 6B are improved. The passive elements 5 further include a capacitor C5 coupled to the regulator circuit 6C. The capacitor C5 can remove noise from power supply voltage supplied from an external apparatus, whereby stable power supply voltage can be supplied to the oscillation circuit 6A and the circuit 6B.

As described above, forming the integrated circuit 6 at the base 2 and housing the passive elements 5 in the housing section S, that is, incorporating the integrated circuit 6 and the passive elements 5 together in the package 10 allows reduction in the area where the integrated circuit 6 and the passive elements 5 are mounted, whereby the size of the entire device can be reduced. In particular, according to the vibrator device 1, the integrated circuit 6 and the passive elements 5 can be placed in a stack in the axis-Z direction, effectively preventing the planar size of the vibrator device 1 from increasing in the axis-X and axis-Y directions. Further, the wiring lines that couple the sections described above, in particular, the wiring lines that couple the oscillation circuit 6A to the vibrator element 4 and the wiring lines that couple the oscillation circuit 6A to the circuit 6B can be shortened, so that noise is unlikely to enter the wiring lines, whereby the integrated circuit 6 can be more stably driven.

The lid 3 is a silicon substrate, as the base 2 is. The coefficients of linear expansion of the base 2 and the lid 3 are therefore equal to each other, so that thermal stress caused by thermal expansion is suppressed, whereby the vibrator device 1 has excellent vibration characteristics. Further, the vibrator device 1 can be formed in a semiconductor process, whereby the vibrator device 1 can be manufactured with precision, and the size of the vibrator device 1 can be reduced. The lid 3 is not necessarily made of a specific material, and a semiconductor substrate that is not made of silicon, for example, a semiconductor substrate made of Ge, GaP, GaAs, InP, or any other suitable substance may be used as the lid 3.

The lid 3 has a bottomed recess 31, which opens via the lower surface of the lid 3 and houses the vibrator element 4 and the passive elements 5, as shown in FIG. 1. The lid 3, specifically, the lower surface thereof is directly bonded to the upper surface 2a of the base 2 via a bonding member 7. The housing section S, which is the space that houses the vibrator element 4 and the passive elements 5, is thus formed between the lid 3 and the base 2. In the present embodiment, the lid 3 is bonded to the base 2 by using, among a variety of types of direct bonding, diffusion bonding utilizing intermetal diffusion. The method for bonding the lid 3 to the base 2 is, however, not limited to a specific method.

The housing section S is hermetically sealed and has a decompressed atmosphere, preferably, in a state closer to vacuum. The oscillation characteristics of the vibrator element 4 are thus improved. The housing section S, however, does not necessarily have a specific atmosphere and may have an atmosphere containing an inert gas, such as nitrogen or Ar, encapsulated in the housing section S. The housing section S also does not necessarily have a decompressed atmosphere and may have an atmospheric-pressure or pressurized atmosphere.

The bonding member 7 has electrical conductivity. The lid 3 is therefore electrically coupled to the base 2 via the bonding member 7. The base 2 is a P-type silicon substrate as described above and is therefore grounded when the vibrator device 1 is driven. That is, the base 2 is coupled to GND, which is fixed potential. The lid 3 is therefore also coupled to GND. The entire package 10 is thus coupled to GND and therefore provides a shielding function of blocking electromagnetic noise from the outside environment. Superposition of electromagnetic noise from the outside environment on the inside of the passive elements 5 and the wiring lines coupled to the passive elements 5 in the housing section S can therefore be effectively suppressed. Further, electromagnetic noise emitted from the interior of the housing section S can be blocked, so that superposition of the electromagnetic noise on the inside of passive elements and wiring lines placed outside the package 10 can be effectively suppressed. Circuits placed around the integrated circuit 6 and the vibrator device 1 can therefore be more stably driven.

In the present embodiment, the base 2 and the lid 3 are coupled to GND as described above, but not necessarily, and at least one of the base 2 and the lid 3 only needs to be coupled to GND. The functions described above can thus be provided.

The vibrator element 4 includes a vibration substrate 41 and electrodes placed at the surface of the vibration substrate 41, as shown in FIG. 2. The vibration substrate 41 operates in a thickness-shear vibration mode and is formed of an AT-cut quartz substrate in the present embodiment. The AT-cut quartz substrate has tertiary frequency-temperature characteristics and therefore forms the vibrator element 4 having excellent temperature characteristics. The electrodes are formed of an excitation electrode 421, which is placed at the upper surface of the vibration substrate 41, and an excitation electrode 422, which is so placed at the lower surface of the vibration substrate 41 as to face the excitation electrode 421. The electrodes include a pair of terminals 423 and 424 placed at the lower surface of the vibration substrate 41, a wiring line 425, which electrically couples the terminal 423 to the excitation electrode 421, and a wiring line 426, which electrically couples the terminal 424 to the excitation electrode 422.

The configuration of the vibrator element 4 is not limited to the configuration described above. For example, the vibrator element 4 may be a mesa-type vibrator element in which a vibration region sandwiched between the excitation electrodes 421 and 422 protrudes from the portion around the vibration region or may conversely be an inverted-mesa-type vibrator element in which the vibration region is recessed from the portion therearound. A peripheral portion of the vibration substrate 41 may be ground in a beveling process, or the vibration substrate 41 may undergo a convex-shape forming process that produces convexly curved upper and lower surfaces.

The vibrator element 4 does not necessarily vibrate in the thickness-shear vibration mode and may, for example, be a vibrator element having a plurality of vibrating arms that undergo bending vibration in the in-plane direction. That is, the vibration substrate 41 is not necessarily formed of an AT-cut quartz substrate and may instead be formed of a quartz substrate other than an AT-cut quartz substrate, for example, an X-cut quartz substrate, a Y-cut quartz substrate, a Z-cut quartz substrate, a BT-cut quartz substrate, an SC-cut quartz substrate, or an ST-cut quartz substrate. In the present embodiment, the vibration substrate 41 is made of quartz, but not necessarily, and may instead be made, for example, of lithium niobate, lithium tantalate, lithium tetraborate, langacite, potassium niobate, gallium phosphate, or any other piezoelectric single crystal or piezoelectric single crystal other than the substances described above. Moreover, the vibrator element 4 is not limited to a piezoelectrically driven vibrator element and may be an electrostatically driven vibrator element using electrostatic force.

The thus configured vibrator element 4 is fixed to the upper surface 2a of the base 2 via a pair of electrically conductive bonding members B1 and electrically coupled to wiring lines placed on the upper surface 2a.

The bonding members B1 and B2 are each not limited to a specific member and may be any member having both electric conductivity and bondability. For example, the bonding members B1 and B2 may each be any of a variety of metal bumps, such as a gold bump, a silver bump, a copper bump, and a solder bump, or an electrically conductive adhesive, such as any of a variety of polyimide-based, epoxy-based, silicone-based, and acrylic adhesives with electrically conductive fillers, such as silver fillers, dispersed therein. Using the former metal bump as each of the bonding members B1 and B2 allows suppression of gases produced from the bonding members B1 and B2 and effective suppression of a change in the environment in the housing section S, in particular, an increase in pressure therein. On the other hand, when the latter electrically conductive adhesive is used as each of the bonding members B1 and B2, the bonding members B1 and B2 are each softer than the metal bump, so that stress induced in the bonding members B1 and B2 is unlikely to be transferred to the vibrator element 4.

The vibrator device 1 has been described above. The vibrator device 1 includes the package 10, which includes the base 2, which is a semiconductor substrate, and the lid 3, which is a semiconductor substrate, and has the housing section S, the vibrator element 4 and the passive elements 5, which are housed in the housing section S and placed at the base 2, the oscillation circuit 6A, which is placed at the base 2 and electrically coupled to the vibrator element 4, and the circuit 6B, which is placed at the base 2 or the lid 3, electrically coupled to the passive elements 5, and operates based on the oscillation signal from the oscillation circuit 6A, as described above. Incorporating the oscillation circuit 6A, the circuit 6B, and the passive elements 5 together in the package 10 as described above allows a reduction in the area where the components described above are mounted, whereby the size of the entire vibrator device can be reduced. Further, since the wiring lines that couple the oscillation circuit 6A to the vibrator element 4 and the wiring lines that couple the oscillation circuit 6A to the circuit 6B can be shortened, so that noise is unlikely to be produced, whereby the circuit 6B can be more stably driven.

Further, the package 10 includes the mounting terminals 651, which are electrically coupled to the passive elements 5 or the circuit 6B and faces in the direction away from the package 10. The vibrator device 1 is thus readily electrically coupled to an external apparatus.

The circuit 6B is placed at the base 2, as described above. The oscillation circuit 6A and the circuit 6B can thus be so placed as to be closer to each other. The wiring lines that electrically couple the circuits to each other can therefore be shortened, so that noise is unlikely to enter the circuits via the wiring lines. The circuit 6B is therefore more stably driven.

The circuit 6B includes a transmission circuit that transmits a pair of differential signals, as described above. The vibrator device 1 thus provides excellent convenience.

At least one of the base 2 and the lid 3, or both in the present embodiment, are coupled to GND, which is fixed potential, as described above. The package 10 can thus provide the shielding function, whereby electromagnetic noise from the outside environment can be blocked. Superposition of electromagnetic noise from the outside environment on the inside of the passive elements 5 and the wiring lines coupled to the passive elements 5 in the housing section S can therefore be effectively suppressed. The circuit 6B can thus exhibit stable characteristics.

Second Embodiment

Figure 4:
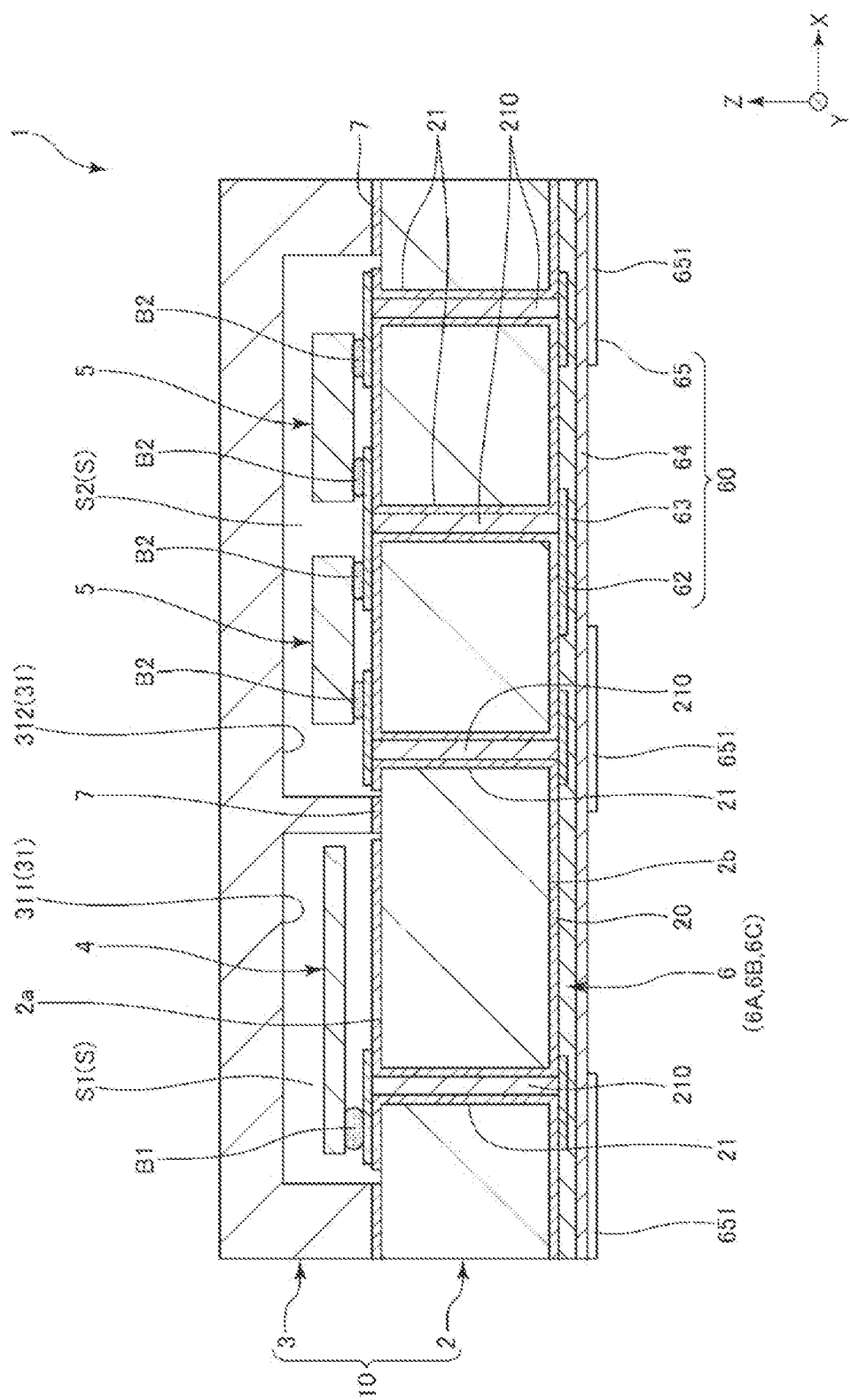
FIG. 4 is a cross-sectional view showing a vibrator device according to a second embodiment.

FIG. 4 is a cross-sectional view showing a vibrator device according to a second embodiment.

The present embodiment is the same as the first embodiment described above except that the package 10 has a different configuration. In the following description, the present embodiment will be described primarily on the difference from the embodiment described above, and the same items will not be described. In FIG. 4, the same configurations as those in the embodiment described above have the same reference characters.

In the vibrator device 1 according to the present embodiment, the lid 3 has two bottomed recesses 311 and 312, as shown in FIG. 4. The housing section S includes a first housing section S1, which houses the vibrator element 4, and a second housing section S2, which houses the plurality of passive elements 5. According to the configuration described above, electromagnetic coupling between the vibrator element 4 and the passive elements 5 can be suppressed because the lid 3 is disposed between the vibrator element 4 and the passive elements 5. Further, for example, when the bonding member B2 is a resin-based adhesive, a situation in which gases produced from the bonding member B2 change and degrade the vibration characteristics of the vibrator element 4 can be avoided.

The thus configured second embodiment can provide the same effects as those provided by the first embodiment described above.

Third Embodiment

Figure 5:
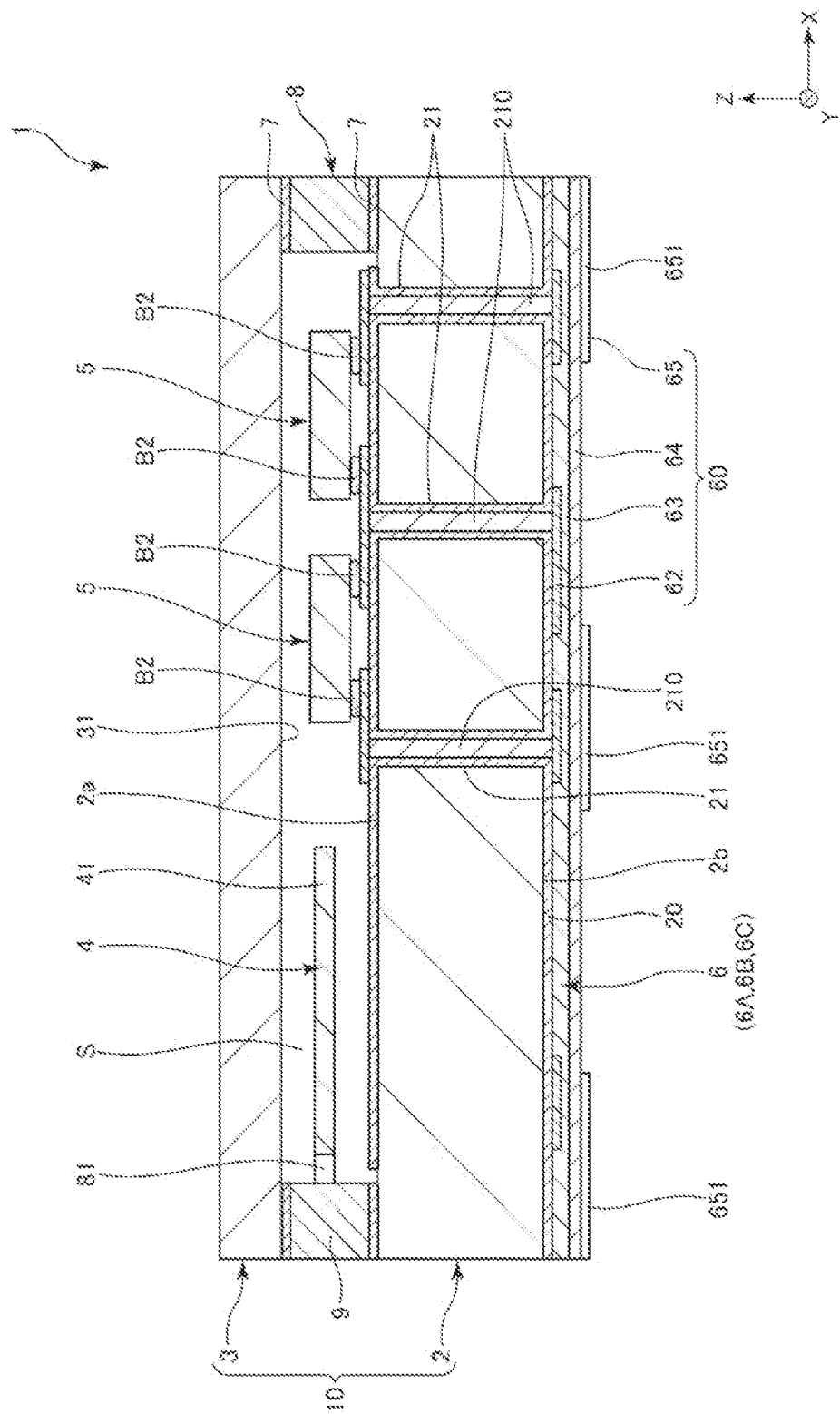
FIG. 5 is a cross-sectional view showing a vibrator device according to a third embodiment.

FIG. 5 is a cross-sectional view showing a vibrator device according to a third embodiment.

The present embodiment is the same as the first embodiment described above except that the package 10 has a different configuration. In the following description, the present embodiment will be described primarily on the difference from the embodiments described above, and the same items will not be described. In FIG. 5, the same configurations as those in the embodiments described above have the same reference characters.

In the vibrator device 1 according to the present embodiment, the base 2 and the lid 3 each have a plate-like shape, as shown in FIG. 5. The package 10 includes a spacer 9, which is interposed between the plate-shaped base 2 and lid 3 and forms the housing section S between the base 2 and the lid 3. The spacer 9 is integrated with the vibrator element 4. Specifically, the vibrator device 1 includes a quartz substrate 8 placed between the base 2 and the lid 3, and the vibration substrate 41, the frame-shaped spacer 9, which surrounds the vibration substrate 41, and a linkage section 81, which links the vibration substrate 41 to the spacer 9, are integrated with the quartz substrate 8. The upper surface of the spacer 9 is bonded to the lid 3 via the bonding member 7, and the lower surface of the spacer 9 is bonded to the base 2 via the bonding member 7. According to the configuration described above, the vibrator device 1 can be more readily manufactured because it is not necessary to form the recess 31 in the lid 3.

As described above, the package 10 in the present embodiment includes the spacer 9, which is interposed between the base 2 and the lid 3 and integrated with the vibrator element 4. It is therefore not necessary to form the recess 31 in the lid 3, whereby the vibrator device 1 is more readily manufactured accordingly.

The thus configured third embodiment can provide the same effects as those provided by the first embodiment described above.

Fourth Embodiment

Figure 6:
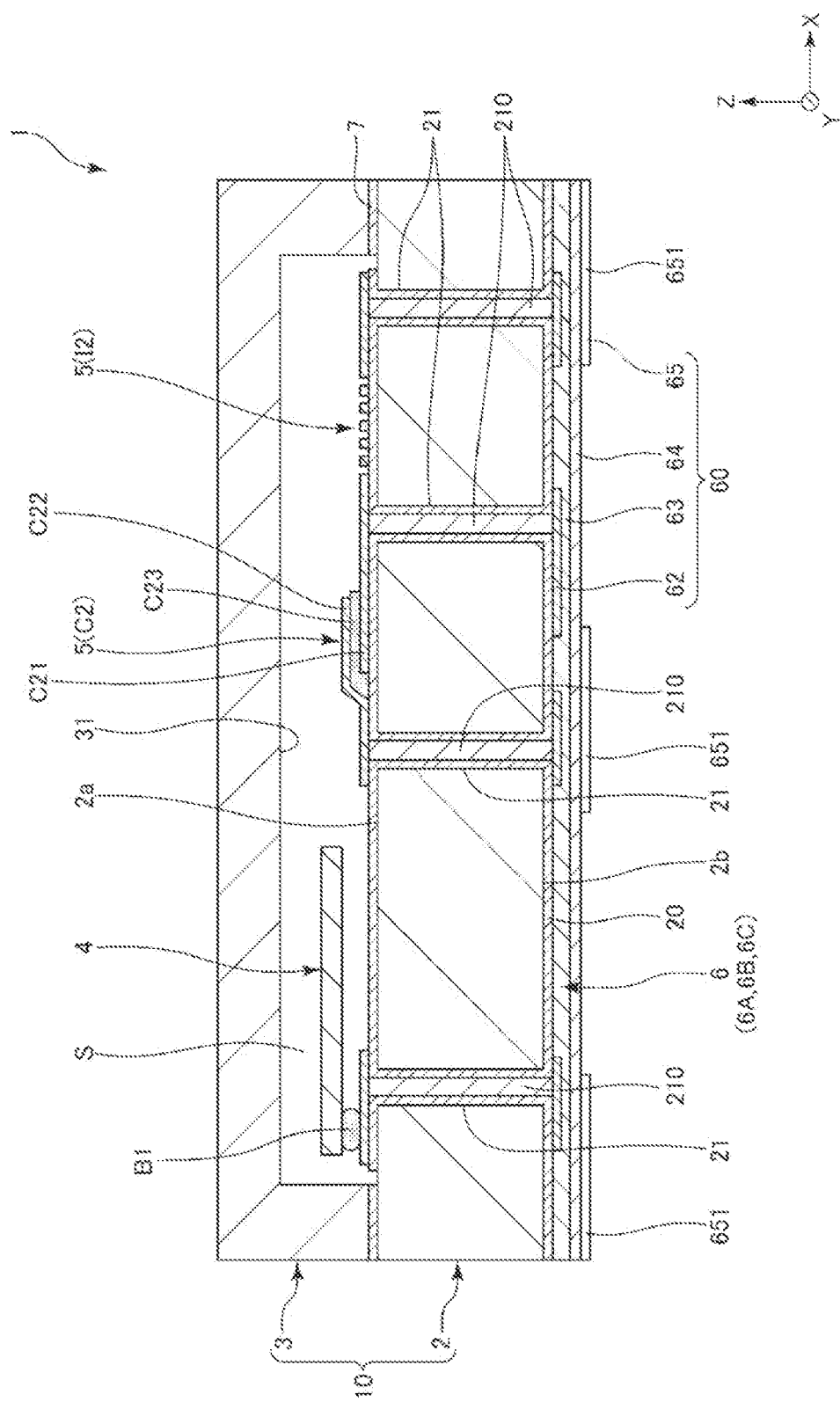
FIG. 6 is a cross-sectional view showing a vibrator device according to a fourth embodiment.

FIG. 6 is a cross-sectional view showing a vibrator device according to a fourth embodiment.

The present embodiment is the same as the first embodiment described above except that the package 10 has a different configuration. In the following description, the present embodiment will be described primarily on the difference from the embodiments described above, and the same items will not be described. In FIG. 6, the same configurations as those in the embodiments described above have the same reference characters.

In the vibrator device 1 according to the present embodiment, thin-film-shaped passive elements 5 are so formed on the upper surface 2a of the base 2 as to be integrated with the base 2, as shown in FIG. 6, unlike the passive elements 5 bonded to the upper surface 2a of the base 2 via the electrically conductive bonding member B2 in the first embodiment described above. More specifically, the capacitor C2, which is one of the passive elements 5, has a configuration in which a dielectric layer C23 is sandwiched between a lower electrode C21 and an upper electrode C22, and the electrodes and the layer are sequentially laminated on the upper surface 2a. Although not shown, the other capacitors C1 and C3 to C5 have the same configuration. The inductor I2, which is one of the passive elements 5, is formed of a spiral wiring line placed at the upper surface 2a. Although not shown, the other inductors I1, I3, and I4 have the same configuration. According to the configuration described above, the vibrator device 1 can be readily manufactured because it is not necessary to position and mount the passive elements 5. Further, since the thickness of the passive elements 5 is suppressed, the height of the vibrator device 1 can be reduced.

When the integrated circuit 6 is formed at the upper surface 2a of the base 2, the passive elements 5 may be formed in the integrated circuit 6.

As described above, the passive elements 5 in the present embodiment are each a thin-film-shaped element integrated with the upper surface 2a, which is a surface of the base 2 that is the surface facing the housing section S. According to the configuration described above, the vibrator device 1 can be readily manufactured because it is not necessary to position and mount the passive elements 5. Further, since the thickness of the passive elements 5 is suppressed, the height of the vibrator device 1 can be reduced as compared with that in the first embodiment described above.

The thus configured fourth embodiment can also provide the same effects as those provided by the first embodiment described above.

Fifth Embodiment

FIG. 7 is a cross-sectional view showing a vibrator device according to a fifth embodiment.

The present embodiment is the same as the first embodiment described above except that the circuit 6B is formed at the lid 3. In the following description, the present embodiment will be described primarily on the difference from the embodiments described above, and the same items will not be described. In FIG. 7, the same configurations as those in the embodiments described above have the same reference characters.

In the vibrator device 1 according to the present embodiment, the integrated circuit 6 is formed at the lower surface 2b of the base 2, and an integrated circuit 6' is formed at an upper surface 3a of the lid 3, as shown in FIG. 7. The oscillation circuit 6A and the regulator circuit 6C are formed in the integrated circuit 6 on the side facing the base 2, and the circuit 6B is formed in the integrated circuit 6' on the side facing the lid 3. The integrated circuit 6' can be formed in the same manner in which the integrated circuit 6 is formed.

In the present embodiment, the circuit 6B is placed at the lid 3, as described above. Therefore, for example, the space where the oscillation circuit 6A, the circuit 6B, and the regulator circuit 6C are formed can be widened as compared with the space in the first embodiment described above. The circuits described above are therefore more readily formed. Further, since the integrated circuits 6 and 6' can be placed in a stack in the axis-Z direction, for example, an increase in the planar size of the vibrator device 1 in the axis-X and axis-Y directions can be suppressed as compared with that in the first embodiment described above. The size of the vibrator device 1 can therefore be reduced.

A plurality of through electrodes 32, which pass through the lid 3 in the thickness direction thereof, are formed in the lid 3, and the integrated circuits 6 and 6' are electrically coupled to each other via the through electrodes 32.

The thus configured fifth embodiment can also provide the same effects as those provided by the first embodiment described above.

The vibrator devices according to the present disclosure have been described above based on the illustrated embodiments, but the present disclosure is not limited thereto, and the configuration of each portion can be replaced with an arbitrary configuration having the same function. Further, another arbitrary constituent element may be added to any of the embodiments of the present disclosure. Moreover, the embodiments may be combined as appropriate with each other.

What is claimed is:

1. A vibrator device comprising:
   a package including a base that is a semiconductor substrate and a lid that is a semiconductor substrate and has a housing section;
   a vibrator element and a passive element housed in the housing section and placed at the base;
   an oscillation circuit placed at the base and electrically coupled to the vibrator element; and
   a circuit that is placed at the base or the lid, is electrically coupled to the passive element, and operates based on an oscillation signal from the oscillation circuit,
   wherein the housing section includes a first housing section that houses the vibrator element and a second housing section that houses the passive element, the first and second housing sections being separated by perimeter walls of the lid that extend about a perimeter of the lid and a center wall that extends in a direction towards and contacts the base, the perimeter walls and the center wall collectively defining a first recess of the lid that defines the first housing section and a second recess of the lid that defines the second housing section.

2. The vibrator device according to claim 1, wherein the package includes a mounting terminal electrically coupled to the passive element or the circuit and facing in a direction away from the package.

3. The vibrator device according to claim 1, wherein the circuit is placed at the base.

4. The vibrator device according to claim 1, wherein the circuit is placed at the lid.

5. The vibrator device according to claim 1, wherein the circuit includes a transmission circuit that transmits a pair of differential signals.

6. The vibrator device according to claim 1, wherein at least one of the base and the lid is coupled to fixed potential.

7. The vibrator device according to claim 1, wherein the package includes a spacer interposed between the base and the lid and integrated with the vibrator element.

8. The vibrator device according to claim 1, wherein the passive element is a thin-film-shaped element integrated with a surface of the base that is a surface facing the housing section.

* * * * *